United States Patent
Lee et al.

(10) Patent No.: US 9,048,732 B2
(45) Date of Patent: Jun. 2, 2015

(54) CONTROL CIRCUIT FOR AC-DC POWER CONVERTER

(71) Applicant: Richtek Technology Corporation, Chupei, Hsinchu (TW)

(72) Inventors: Yi-Wei Lee, Taipei (TW); Chih-Feng Huang, Hsinchu County (TW); Kuo-Chin Chiu, Hsinchu County (TW)

(73) Assignee: Richtek Technology Corporation, Hsinchu (TW)

( * ) Notice: Subject to any disclaimer, the term of this patent is extended or adjusted under 35 U.S.C. 154(b) by 0 days.

(21) Appl. No.: 14/294,789

(22) Filed: Jun. 3, 2014

(65) Prior Publication Data

US 2014/0355320 A1  Dec. 4, 2014

(30) Foreign Application Priority Data

Jun. 3, 2013  (TW) .............................. 102119677 A

(51) Int. Cl.
| | |
|---|---|
| *H02M 7/217* | (2006.01) |
| *H02M 7/537* | (2006.01) |
| *H01L 29/808* | (2006.01) |
| *H02M 7/00* | (2006.01) |
| *H01L 29/06* | (2006.01) |

(52) U.S. Cl.
CPC .............. *H02M 7/217* (2013.01); *H02M 7/003* (2013.01); *H02M 7/537* (2013.01); *H01L 29/808* (2013.01); *H01L 29/0692* (2013.01)

(58) Field of Classification Search
CPC ..... H02M 7/003; H02M 7/217; H02M 7/537; H01L 29/808; H01L 29/0692
USPC .............. 363/18, 19, 127, 131, 147; 257/272, 257/274
See application file for complete search history.

(56) References Cited

U.S. PATENT DOCUMENTS

| | | | |
|---|---|---|---|
| 7,306,999 B2 | 12/2007 | Hall et al. | |
| 7,638,405 B2 | 12/2009 | Hall et al. | |
| 7,696,566 B2 * | 4/2010 | Disney | 257/329 |
| 7,803,643 B2 | 9/2010 | Hall et al. | |
| 7,955,943 B2 | 6/2011 | Hall et al. | |
| 8,283,705 B2 | 10/2012 | Saito et al. | |
| 8,680,622 B2 * | 3/2014 | Saito | 257/379 |
| 2009/0323376 A1 | 12/2009 | Saito | |
| 2012/0154026 A1 * | 6/2012 | Karino et al. | 327/543 |
| 2013/0032863 A1 * | 2/2013 | Kawahara et al. | 257/272 |

* cited by examiner

*Primary Examiner* — Jessica Han
(74) *Attorney, Agent, or Firm* — Birch, Stewart, Kolasch & Birch, LLP

(57) ABSTRACT

A control circuit for an AC-DC power converter includes a junction field effect transistor (JFET), a first resistor, a second resistor, and a third resistor. The JFET includes a substrate, a drain, a source, a gate, a first oxide layer, and a second oxide layer. The first oxide layer is attached to a region located between the drain and the gate of the JFET, and the second oxide layer is not attached to a region located between the drain and the gate of the JFET. The first resistor is positioned on the first oxide layer, and the second resistor and the third resistor are positioned on the second oxide layer. When the JFET and the first resistor receive an input power signal, the first, the second, and the third resistors divide the input power signal, and prevent from the breakdown of the first oxide layer and the second oxide layer.

7 Claims, 4 Drawing Sheets

CONTROL CIRCUIT FOR AC-DC POWER CONVERTER

CROSS-REFERENCE TO RELATED APPLICATIONS

This application claims the benefit of priority to Patent Application No. 102119677, filed in Taiwan on Jun. 3, 2013; the entirety of which is incorporated herein by reference for all purposes.

BACKGROUND

The disclosure generally relates to an AC-DC power converter and, more particularly, to the control circuit of the AC-DC power converter which may sustain high voltage.

Along with the depletion of the energy, many industrial standards require the electronic products to utilize the energy more efficiently. In many electronic products, the AC-DC power convert is utilized to convert the input power signal to suitable output voltage signals or output current signals for providing power to the load. Improving the energy efficiency of the AC-DC power converter is therefore an important topic.

The control circuit of the AC-DC power convert may detect the input power signal and configure the AC-DC power converter to operate in a suitable operation mode. For example, when the control circuit does not detect the input power signal, the control circuit may discharge the EMI suppression capacitor to prevent the users from electric shocks and comply with the safety standards The control circuit therefore must be directly coupled with the input power signal to accurately configure the AC-DC power converter to the suitable operation mode. The voltage value of the input power signal, however, usually ranges from 90 volts to 270 volts, and may be even higher. When the control circuit is directly coupled with the input power signal, the control circuit must sustain 400 volts or higher DC signals (e.g., 700 volts is commonly required in the industry). When the control circuit is realized with integrated circuit, the control circuit usually may not sustain such high voltage signals.

In the U.S. Pat. Nos. 7,306,999; 7,638,405; 7,803,643; 7,955,943 and 8,283,705, several control circuits for the AC-DC power converter are disclosed. The control circuits utilize a high voltage detection circuit to detect the input power signal. When the control circuits are realized with integrated circuit, the circuit layouts of the resistors and other circuit elements must be carefully designed. Otherwise, the circuit elements are vulnerable because of the variations in the circuit layout or the variation of the semiconductor fabrication. The hardware complexity of the control circuit is greatly increased and the yield of the control circuit may not be easily enhanced.

SUMMARY

In view of the foregoing, it may be appreciated that a substantial need exists for methods and apparatuses that mitigate or reduce the problems above.

An example embodiment of a control circuit for an AC-DC power converter is disclosed, for configuring the AC-DC power converter to supply power to a load according to an input power signal, comprising: a junctional field effect transistor, comprising: a substrate of a first doping type; a well of a second doping type, positioned on a surface of the substrate; a drain of the second doping type, positioned in the well, configured to operably receiving the input power signal; a source of the second doping type, position in the well, configured to operably couple with a first voltage level; a gate of the first doping type, positioned in the well and positioned between the drain and the source; a first oxide layer, positioned on a surface of the well and attached to a first region located between the drain and the gate; and a second oxide layer, positioned on the surface of the well and not attached to the first region; a first resistor, positioned on the first oxide layer and comprising a first terminal and a second terminal; a second resistor, positioned on the second oxide layer and comprising a first terminal and a second terminal; and a third resistor, positioned on the second oxide layer and comprising a first terminal and a second terminal; wherein the first terminal of the first resistor is configured to operably receive the input power signal; the first terminal of the second resistor is coupled with the second terminal of the first resistor; the first terminal of the third resistor is coupled with the second terminal of the second resistor; the second terminal of the third resistor is configured to operably couple with a third voltage level; the gate is coupled with the first oxide layer and configured to operably coupled with a second voltage level; and a voltage dividing signal is provided at the second terminal of the second resistor and the first terminal of the third resistor.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
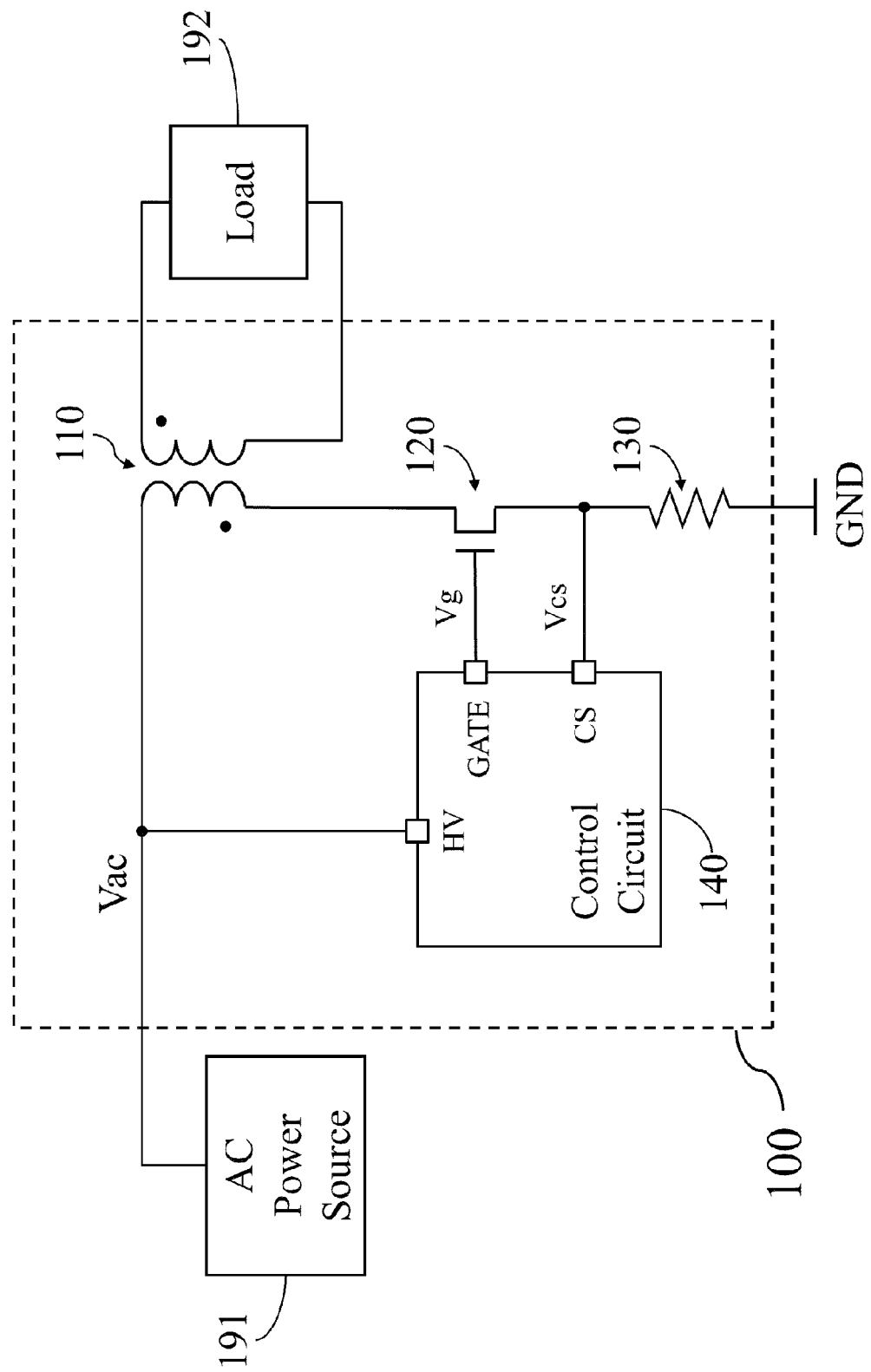
FIG. 1 shows a simplified functional block diagram of a power converter according to one embodiment of the present disclosure.

FIG. 1 shows a simplified functional block diagram of an AC-DC power converter 100 according to one embodiment of the present disclosure. The power converter 100 comprises a transformer 110, a current switch 120, a resistor 130 and a control circuit 140 for providing power to a load 192 according to an input power signal Vac of an AC power source 191. For the purposes of conciseness and clear explanation, other components and connections of the power converter 100 are not shown in FIG. 1.

In the embodiment in FIG. 1, the transformer 110 is coupled between the AC power source 191 and the load 192. One terminal of the current switch 120 is coupled with the transformer 110 and another terminal of the current switch 120 is coupled with one terminal of the resistor 130. Another terminal of the resistor 130 is coupled with the voltage level of the ground GND. The control circuit 140 is realized with integrated circuits and coupled with the AC power source 191 through the pin HV. The control circuit 140 is coupled with a control terminal of the current switch 120 through the pin GATE and coupled with the resistor 130 through the pin CS.

The control circuit 140 may transmit the control signal Vg to the control terminal of the current switch 120 through the pin GATE for configuring the conduction status of the current switch 120. The control circuit 140 may receive the current sense signal Vcs through the pin CS for configuring the control signal Vg and therefore for adjusting the conduction status of the current switch 120.

Moreover, the control circuit 140 may receive the input power signal Vac through the pin HV for configuring the conduction status of the current switch 120 or performing other suitable operations. For example, in one embodiment, when the control circuit 140 detects the input power signal Vac is less than a predetermined signal value, the control circuit 140 discharges a EMI suppression capacitor (not shown in FIG. 1) to prevent the users from electric shocks and comply with the safety standards.

Figure 2:
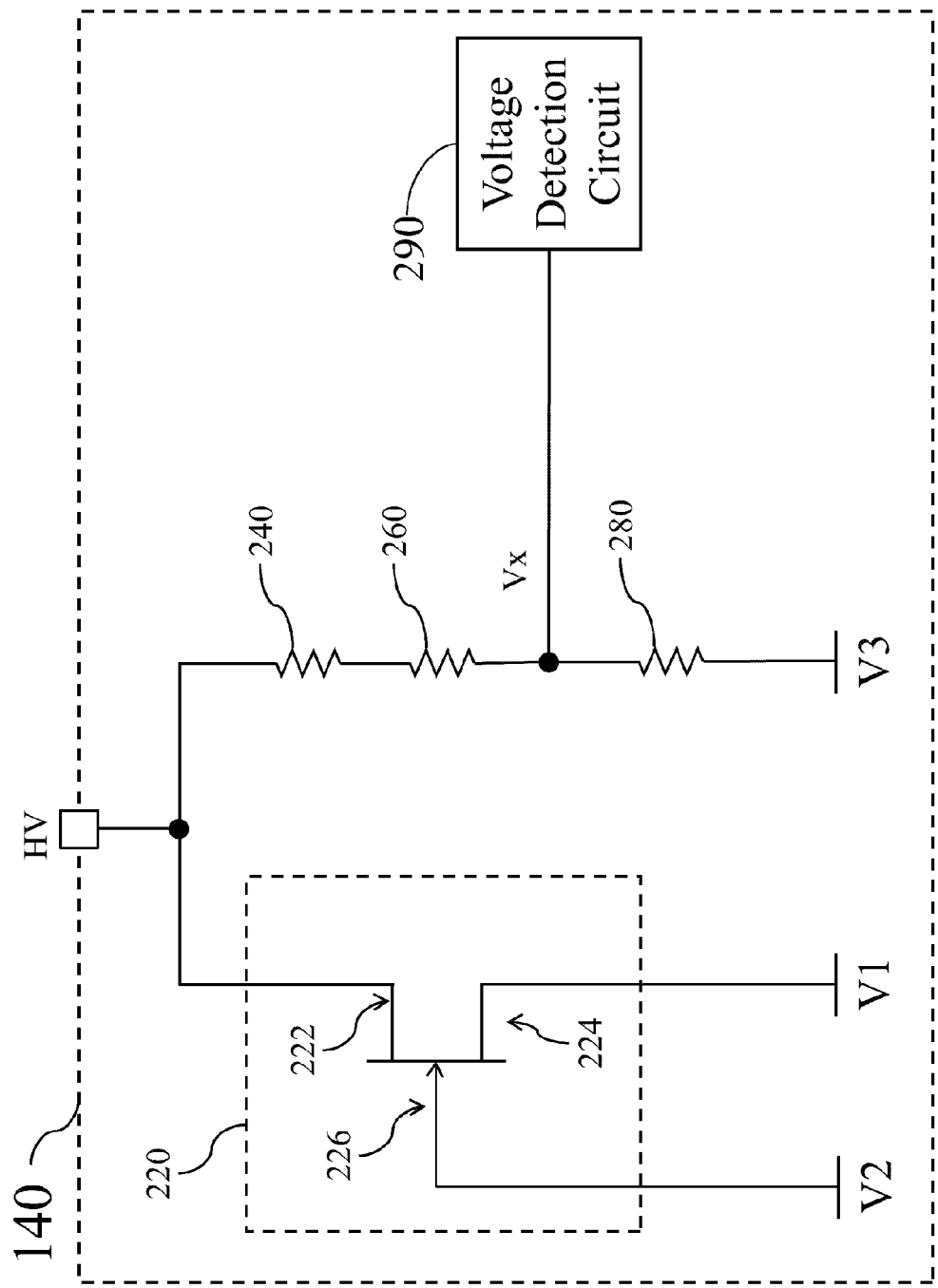
FIG. 2 shows a simplified circuit diagram of part of the control circuit in FIG. 1 according to one embodiment of the present disclosure.

FIG. 2 shows a simplified circuit diagram of part of the control circuit 140 in FIG. 1 according to one embodiment of the present disclosure. In the embodiment in FIG. 2, the control circuit 140 comprises a junction field effect transistor (JFET) 220, a first resistor 240, a second resistor 260, a third resistor 280 and a voltage detection circuit 290. For the purposes of conciseness and clear explanation, other components and connections of the control circuit 140 are not shown in FIG. 2.

In the embodiment in FIG. 2, the JFET 220 is realized with an N-type channel JFET. The drain 222 of the JFET 220 is coupled with the pin HV. The source 224 of the JFET 220 is coupled with a first voltage level V1. The gate 226 of the JFET 220 is coupled with a second voltage level V2. A first terminal of the resistor 240 is coupled with the drain 222 of the JFET 220 and the pin HV. A first terminal of the resistor 260 is coupled with a second terminal of the resistor 240. A first terminal of the resistor 280 is coupled with a second terminal of the resistor 260. A second terminal of the resistor 280 is coupled with a third voltage level V3. The voltage detection circuit 290 is coupled with the second terminal of the resistor 240 and the first terminal of the resistor 260.

The JFET 220 is configured to operably couple with the AC power source 191 for receiving the input power signal Vac. For example, the JFET 220 may cooperate with other circuits (not shown in FIG. 2) for configuring the startup operations of the control circuit 140 or for discharging the EMI suppression capacitor.

The resistors 240, 260 and 280 are utilized to provide a voltage dividing signal Vx according to the input power signal Vac. The voltage detection circuit 290 may configure the operations of the control circuit 140 according to the voltage dividing signal Vx. For example, in one embodiment, the voltage detection circuit 280 may configure the signal value, the frequency and/or the duty cycle of the control signal Vg according to the voltage dividing signal Vx. In another embodiment, the voltage detection circuit 290 may configure the JFET 220 and/or other circuit elements to discharge the EMI suppression capacitor according to the voltage dividing signal Vx. The voltage detection circuit 290 may be realized with the comparator circuit, the signal processor, microcontroller, etc.

Because the voltage value of the input voltage signal Vac received by the pin HV may be as high as several hundred volts, the JFET 220, the resistors 240, 260 and 280 and relevant circuit element must be properly designed to prevent the control circuit 140 from damaging by the high voltage of the input power signal Vac.

Figure 3:
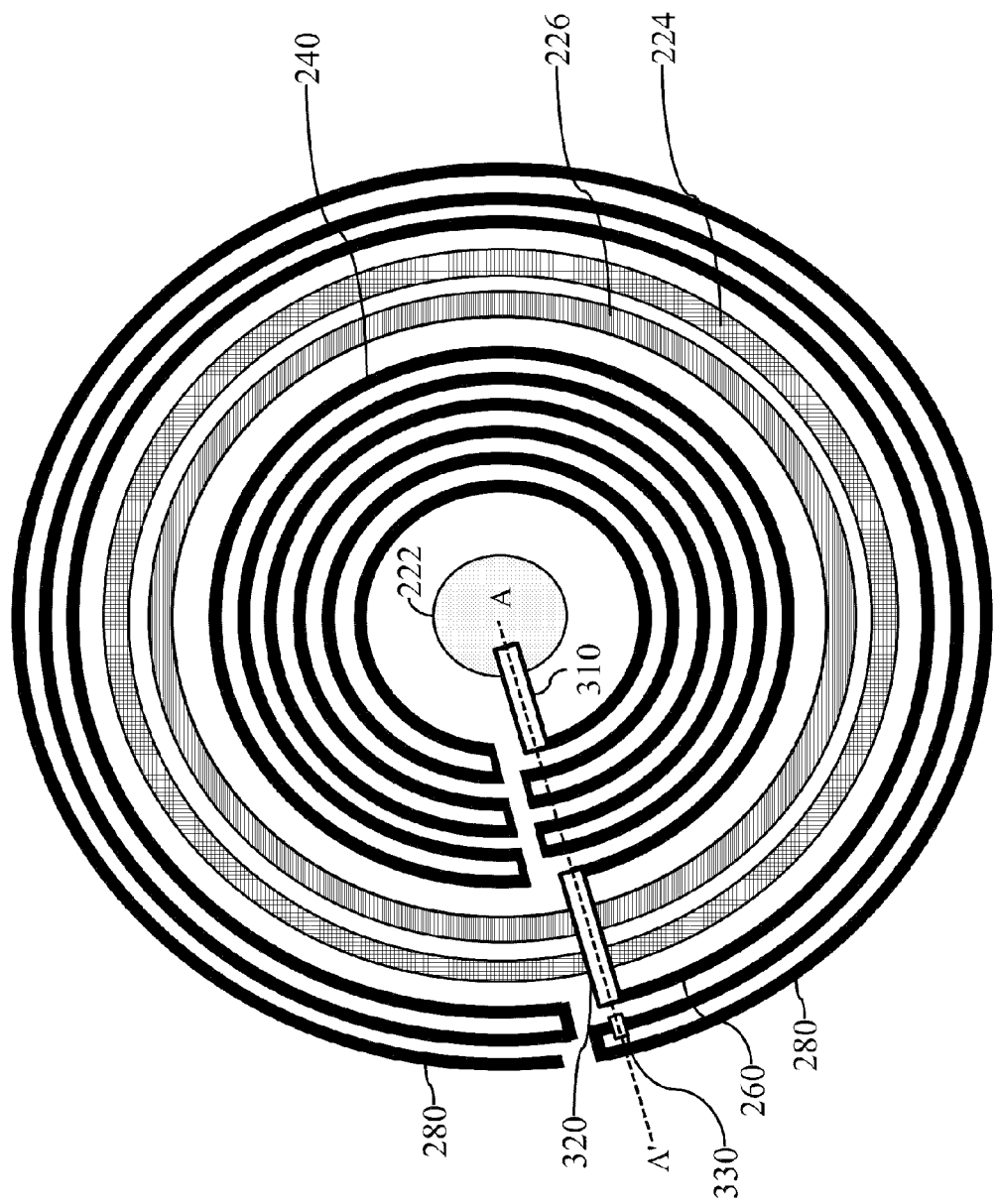
FIG. 3 shows a simplified circuit layout of the junction field effect transistor and the resistors in FIG. 2 according to one embodiment of the present disclosure.
Figure 4:
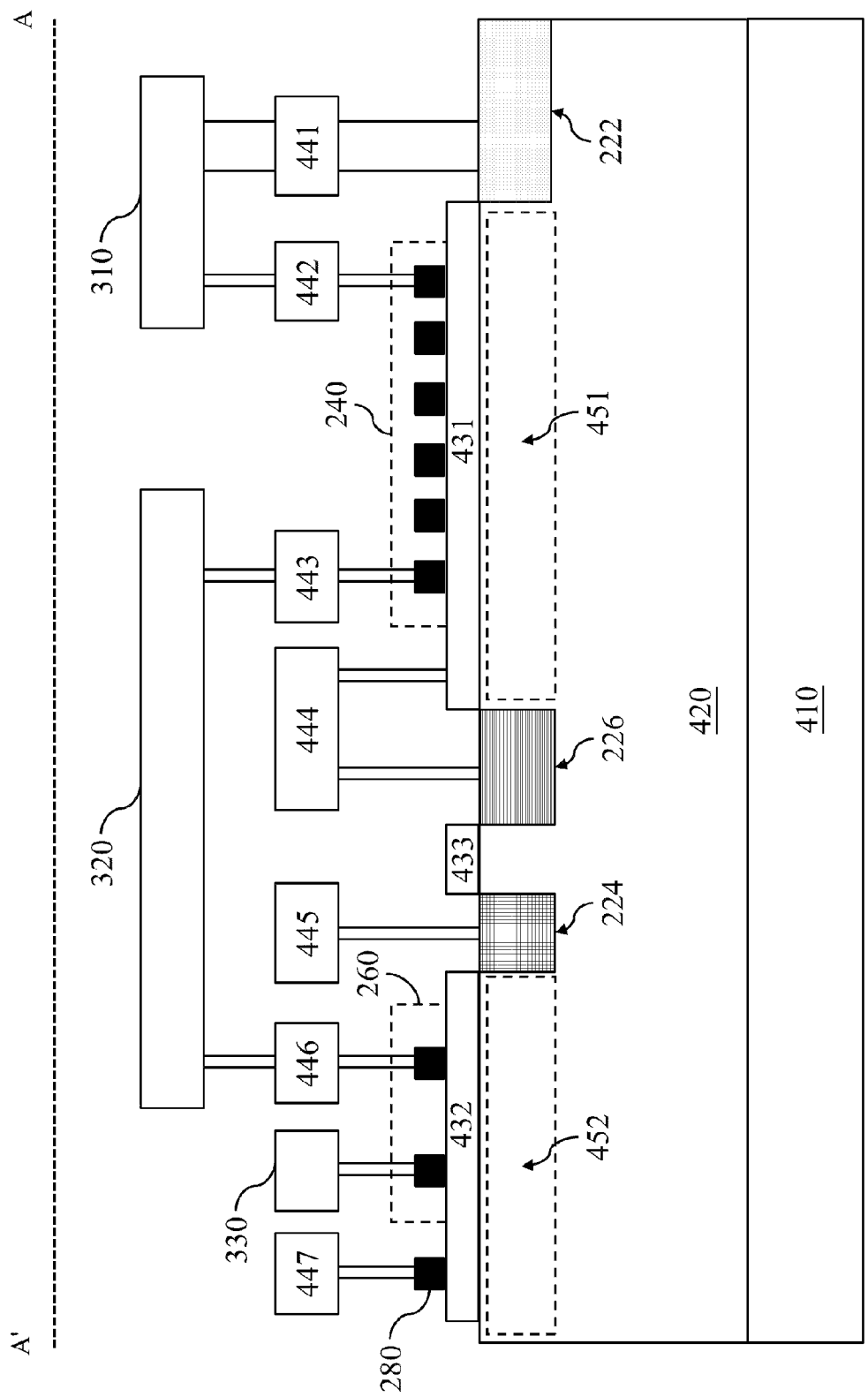
FIG. 4 shows a simplified sectional view of the junction field effect transistor and the resistors in FIG. 3 according to one embodiment of the present disclosure.

FIG. 3 shows a simplified circuit layout of the JFET 220 and the resistors 240, 260 and 280 in FIG. 2 according to one embodiment of the present disclosure. FIG. 4 shows a simplified sectional view of the JFET 220 and the resistors 240, 260 and 280 along the line A-A' in FIG. 3 according to one embodiment of the present disclosure. For the purposes of conciseness and clear explanation, other components and connections are not shown in FIG. 3 or 4. For example, the substrate 410, the well 420, the oxide layers 431-433 and the conductor 441-447 are shown in FIG. 4 but not shown in FIG. 3. The body of the JFET 220 is also not shown in FIGS. 3 and 4.

In the embodiments in FIGS. 2-4, the JFET 220 is realized by an N-type channel JFET. Therefore, the substrate 410 is a P-type doped substrate. The well 420 is positioned on a surface of the substrate 410 and is N-type doped. The P-type doping may also be referred to as the first doping type and the N-type doping may also be referred to as the second doping type in the following embodiment. The drain 222, the source 224 and the gate 226 are positioned in the well 420. The drain 222 and the source 224 are N-type doped and the gate 225 is P-type doped.

A first oxide layer 431 is positioned on a surface of the well 420 and attached to a region located between the drain 222 and the gate 226. For example, the oxide layer 431 may be positioned in the circular region between the drain 222 and the gate 226 in FIG. 3 and attached to a first region 451 is located between the drain 222 and the gate 226 in FIG. 4. The second oxide layer 432 is positioned on the surface of the well 420 and not attached to the region located between the drain 222 and the gate 226. For example, the oxide 432 may be positioned in the exterior of the source 224 in FIG. 3 and attached to a second region 452 in FIG. 4. The third oxide layer 433 is positioned on the surface of the well 420 and attached to the region located between the drain 222 and the gate 226.

The resistor 240 is positioned on a surface of the oxide layer 431, e.g. the resistor 240 is realized with multiple connected curved patterns positioned in the circular region located between the drain 222 and the gate 226 in FIG. 3. In this embodiment, the first terminal of the resistor 240 is coupled with the drain 222 through the conductors 442, 310 and 441, as shown in FIG. 4.

The resistors 260 and 280 are positioned on a surface of the oxide layer 432, e.g., the resistors 260 and 280 are realized with multiple connected curved patterns positioned in the exterior of the source 224 in FIG. 3. In this embodiment, the first terminal of the resistor 260 is coupled with the resistor 240 through the conductors 446, 320 and 443, as shown in FIG. 4. The resistor 280 is configured to operably couple with the third voltage level V3 through the conductor 447. The resistors 260 and 280 may be utilized to provide the voltage dividing signal Vx through the conductor 330.

The conductor 444 is utilized to couple the gate 226 with the oxide layer 431, and the conductor 445 is utilized to couple with the source 224. Moreover, for the purposes of conciseness and clear explanation, some components coupled with the conductors 441, 444 and 445, the drain 222, the gate 226, the oxide layer 431, the source 224, etc. are not shown in FIG. 4. For example, the polysilicon element between the conductor 444 and the oxide layer 431 is not shown in FIG. 4.

Because the voltage value of the input power signal Vac received by the drain 222 of the JFET 220 may be as high as several hundred volts, the second voltage level V2 coupled with the gate of the JFET 220 is usually configured to be the voltage level of the ground or the voltage level far less than the signal level of the input power signal Vac. Therefore, the structure between the drain 222 and the gate 226 of the JFET 220 (e.g., the circular region between the drain 222 and the gate 226 in FIG. 3, and the first region 451 in FIG. 4) must be capable of sustaining the voltage of hundreds of volts and still function normally. Moreover, because the first terminal of the resistor 240 is utilized to couple with the input power signal Vac, the third voltage level V3 coupled with the second terminal of the resistor 280 is usually configured to be the voltage level of the ground or the voltage level far less than the signal level of the input power signal Vac. The resistors 240, 260 and 280 may provide the voltage dividing signal Vx according to the input power signal Vac and the third voltage level V3.

When the voltage difference between the resistor 240 and the region 451 located between the drain 222 and the gate 226 is greater than the punch-through voltage (also known as the breakdown voltage), the oxide layer 431 is punched through and the JFET 220 is damaged. Conventionally, the circuit layout patterns of the resistor 240 must be very carefully designed so that the voltage difference between each part of the resistor 240 and the region underneath the oxide layer 431 may be configured to be less than the punch-through voltage. Enormous time must be spent on the design and verification of the circuit layout, but the carefully crafted circuit layout still susceptible to the variation of the semiconductor fabrication and easily damaged. The embodiments in this disclosure may resolve the above mentioned problem in the circuit layout.

In one embodiment, the drain 222 of the JFET is coupled with the input power signal Vac with a voltage of 700 volts. The second voltage level V2 coupled with the gate 226 and the third voltage level V3 coupled with the second terminal of the resistor 280 are both configured to be 0 volt. Therefore, in the first region 451 in FIG. 4, the voltage value gradually decreases from 700 volts at the drain 222 to 0 volt at the gate 226. Because the resistors 240, 260 and 280 divide the voltage difference between input power signal Vac and the third voltage level V3, the resistances R240, R260 and R280 respectively of the resistors 240, 260 and 280 may be suitably configured so that the voltage at the conductor 443 coupled with the resistor 240 is less than a predetermined voltage value (e.g., the predetermined voltage value may be configured to be the punch-through voltage of the oxide layer 431). As for the oxide layer 431, the voltage difference between the conductor 443 coupled with the resistor 240 and the first region 451 is maximal. Therefore, by configuring the voltage value at the conductor 443 to be less than the predetermined voltage value, the oxide layer 431 may therefore not be punched through. For example, when the punch through voltage of the oxide layer 431 is 300 volts, the resistance of the resistor 240 may be configured to be three times the sum of the resistances of the resistors 260 and 280, i.e., R240=3× (R260+R280). The voltage value at the conductor 443 is therefore equal to 175 volts (i.e., 700 volt×¾). The voltage difference between the conductor 443 and the first region 451 is less than or equal to 175 volts, which is less than the punch-through voltage 300 volts of the oxide 431. The oxide layer 431 may therefore not be punched through. Moreover, as for the oxide layer 432, the voltage difference between the conductor 446 coupled with the resistor 260 and the second region 452 is maximal. The voltage at the conductor 446 is substantially equal to the voltage at the conductor 443. Therefore, the oxide layer 432 may also not be punched through.

In the above embodiments, to ensure the voltage at the conductor 443 may be less than the predetermined voltage value (e.g., less than the punch-through voltage of the oxide 431), the resistance of the resistor 240 may be configured to be greater than the sum of the resistances of the resistors 260 and 280. In one embodiment, the resistance of the resistor 240 may be configured to be two times the sum of the resistances of the resistors 260 and 280. In another embodiment, the resistance of the resistor 240 may be configured to be three or more times the sum of the resistances of the resistors 260 and 280.

In the above embodiments, by suitably configuring the resistances of the resistor 240, 260 and 280, when the resistor 240 is coupled with the input power signal Vac, the minimum voltage value of the resistor 240 on the oxide layer 431 (e.g., the voltage at the conductor 443) is far greater than the voltage value of the second voltage level V2 (e.g., by two orders of magnitude) and less than the punch-through voltage of the oxide layer 431. Moreover, the maximum voltage at the resistors 260 and 280 on the oxide layer 432 (e.g., the voltage value at the conductor 446) is less than the punch-through voltage of the oxide layer 432. Therefore, in the above embodiments, the oxide layer 431 and 432 may not be punched through and may tolerate more variation of the semiconductor fabrication because the layout patterns of the resistors 240, 260 and 280 does not affect the voltages at the conductors 443 and 446.

In the embodiment in FIG. 1, the power converter 100 is a flyback power converter. The control circuit 140 in FIGS. 2-4, however, still may be applied to the boost power converter, the buck power converter, the buck-boost power converter, etc.

In the embodiment in FIG. 3, the drain 222, the source 224 and the gate 226 of the JFET are respectively realized with round and circular patterns. The resistors 240, 260 and 280 are respectively realized with multiple connected curved patterns. The conductors 310, 320 and 330 are respectively realized with rectangular patterns. In other embodiment, each of the above elements may be respectively realized with suitable geometric pattern(s). Because the layout pattern of the above element does not affect the voltages at the conductors 443 and 446, the above elements may be respectively designed in suitable geometric patterns so that the layout complexity may be further reduced.

In the embodiment in FIG. 3, the conductors 310, 320 and 330 are configured on the virtual line A-A' for the purpose of clear explanation. In other embodiment, the conductors 310, 320 and 330 may be respectively configured in the suitable positions and do not need to be aligned.

In the embodiment in FIG. 4, the layouts of the conductors 310-330 and 441-447 are realized with two layers of metal for coupling with other conductors and elements. In other embodiments, the numbers of conductors and the layers of metal may be suitably configured according to different design considerations.

In the above embodiments, the resistor 240 is only positioned on the surface of the oxide layer 431 and the resistors 260 and 280 only positioned on the surface of the oxide layer 432. In other embodiments, the resistor 240 is only positioned on the surface of the oxide layer 431 and the resistors 260 and 280 may be respectively positioned on the surface of the oxide layer 431 and on the surface of the oxide layer 432.

In the above embodiments, the doping concentrations of the drain 222 and the source 224 may be configured to be greater than the doping concentration of the well 420.

In the embodiment in FIG. 2, the source 224 and the gate 226 of the JFET 220 and the resistor 280 are respectively coupled with the voltage levels V1, V2 and V3. The voltage levels V1, V2 and V3 may be respectively configured to be a fixed voltage level or a variable voltage level provided by other circuits. The voltage levels V1, V2 and V3 may be respectively configured to be the same or different voltage values according to different design considerations.

In the above embodiments, the source 224 may be realized with the suitable layout pattern, e.g. a closed geometric pattern (circle, rectangle, triangle, and polygon) so that the first region 451 locates in the geometric pattern of the source 224 and the second region 452 locates in the exterior of the geometric pattern of the source 224. The resistor 240 is positioned on the oxide layer 431 on the first region 451 and at least one of the resistors 260 and 280 is positioned on the oxide layer 432 on the second region 452.

In the above embodiments, the resistors 260 and 280 may be realized with the suitable layout pattern, e.g. a continuous geometric pattern (multiple connected lines and/or curves) and the conductor 330 coupled with the geometric pattern is utilized to provide the voltage dividing signal Vx.

In the above embodiments, when the resistances of the resistors 240, 260 and 280 are suitably configured, the oxide layers 431, 432 and 433 of the JFET may not be punch-through. There is no need to consider the voltage differences between the layout patterns and the region underneath the oxide layer as other solutions do. The limitation on the circuit layout of the control circuit may be greatly reduced in the above embodiments. The above embodiments may tolerate more variation of the semiconductor fabrication and reduce the complexity of the layout. Therefore, the hardware complexity of the control circuit may be reduced and the yield the control circuit may be improved.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Throughout the description and claims, the term "element" contains the concept of component, layer, or region.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A control circuit for an AC-DC power converter, for configuring the AC-DC power converter to supply power to a load according to an input power signal, comprising:
    a junctional field effect transistor, comprising:
    a substrate of a first doping type;
    a well of a second doping type, positioned on a surface of the substrate;
    a drain of the second doping type, positioned in the well, configured to operably receiving the input power signal;
    a source of the second doping type, position in the well, configured to operably couple with a first voltage level;
    a gate of the first doping type, positioned in the well and positioned between the drain and the source;
    a first oxide layer, positioned on a surface of the well and attached to a first region located between the drain and the gate; and
    a second oxide layer, positioned on the surface of the well and not attached to the first region;
    a first resistor, positioned on the first oxide layer and comprising a first terminal and a second terminal;
    a second resistor, positioned on the second oxide layer and comprising a first terminal and a second terminal; and
    a third resistor, positioned on the second oxide layer and comprising a first terminal and a second terminal;
    wherein the first terminal of the first resistor is configured to operably receive the input power signal; the first terminal of the second resistor is coupled with the second terminal of the first resistor; the first terminal of the third resistor is coupled with the second terminal of the second resistor; the second terminal of the third resistor is configured to operably couple with a third voltage level; the gate is coupled with the first oxide layer and configured to operably coupled with a second voltage level; and a voltage dividing signal is provided at the second terminal of the second resistor and the first terminal of the third resistor.

2. The control circuit of claim 1, wherein a resistance of the first resistor is greater than a sum of a resistance of the second resistor and a resistance of the third resistor.

3. The control circuit of claim 1, wherein when the first resistor receives the input power signal, a minimum voltage of the first resistor is greater than the voltage of the second voltage level and less than a punch-through voltage of the first oxide layer.

4. The control circuit of claim 3, wherein a maximum voltage of the second resistor is less than a punch-through voltage of the second oxide layer.

5. The control circuit of claim 1, further comprising:
   a voltage detection circuit, configured to operably configure the junction field effect transistor to discharge a capacitor when the voltage dividing signal is less than a predetermined signal value.

6. The control circuit of claim 1, wherein the source comprises a closed geometric pattern; the first region locates in the geometric pattern; and at least one of the second resistor and the third resistor locate outside the geometric pattern.

7. The control circuit of claim 1, wherein the second resistor and the third resistor are a continuous geometric pattern; and a conductor is coupled with the geometric pattern for providing the voltage dividing signal.

\* \* \* \* \*